United States Patent [19]

Roylance et al.

[11] Patent Number: 4,482,845
[45] Date of Patent: Nov. 13, 1984

[54] PROCESS FOR PREVENTING INADVERTENT ACTUATION OF CONTROLS

[75] Inventors: William H. Roylance, 1654 Redondo Ave., Salt Lake City, Utah 84105; Byron D. Roylance, Salt Lake City, Utah

[73] Assignee: William H. Roylance, Salt Lake City, Utah

[21] Appl. No.: 429,067

[22] Filed: Sep. 30, 1982

[51] Int. Cl.³ ............................................. H05B 37/02
[52] U.S. Cl. ..................................... 315/360; 307/234; 307/510
[58] Field of Search ............... 361/110, 111, 182, 194, 361/171; 328/138, 140, 110; 307/112, 132, 134, 510, 517, 518, 234, 247 A; 340/587, 573; 315/360, 362

[56] References Cited

U.S. PATENT DOCUMENTS

| | | | |
|---|---|---|---|
| 3,226,680 | 12/1965 | Koller et al. | 307/234 |
| 3,500,369 | 3/1970 | Kellem | 307/234 |
| 3,634,869 | 1/1972 | Hsueh | 307/517 |
| 3,940,632 | 2/1976 | Padgug | 315/360 |

Primary Examiner—Harold Dixon
Attorney, Agent, or Firm—Lynn G. Foster

[57] ABSTRACT

A method for preventing the accidental activation of controls both electrical and mechanical such as switches, buttons, levers, triggers, etc. This consists of requiring the user to activate the control two or more times within a predesignated time period (usually very short) before the control will perform its control function. The method can be used for safety purposes such as preventing firearm triggers from being tripped accidentally and turning machines on by mistake. Or it can be used for convenience such as with a lamp that will only turn on or off when a physical object such as a hand is placed near it twice or more within a short time span. It is ideal, as mentioned above, for making proximity switches more practical because they no longer can be triggered accidentally with ease as is possible in their present forms. One electrical means of performing this method is shown and described in this patent application, but many means can be used.

12 Claims, 4 Drawing Figures

PROCESS FOR PREVENTING INADVERTENT ACTUATION OF CONTROLS

FIELD OF INVENTION

This invention deals with an apparatus and process for preventing accidental actuation of controls of any kind but primarily electrical controls and more particularly electrical switches.

BACKGROUND

Most of man's machines and electrical devices have controls of some type to regulate their functions. Such controls consist of such items as buttons, triggers, levers, dials, pedals, toggle sticks, etc. Many times prior art controls of the indicated type are actuated accidentally, with inconvenient and sometimes disastrous results. Examples include: pulling the trigger on a gun by mistake, turning on an electrical switch accidentally in cases where the switch operates a machine, or pressing the shutter release on a camera unintentionally.

Many methods have been employed in the past to prevent such accidents. With respect to guns, a safety lock has been provided, which must be released before the trigger can be pulled. In the case of electrical switches, two or more buttons or levers must be actuated before the current is turned on. Some switches are placed in hard-to-reach places, and some require a complex manipulation of the switch before it will perform its function. All of these prior methods have the drawback of requiring the user to expend extra effort or skill.

Further, none of the known methods work on what is the handiest, yet most infrequently used control. This is the proximity switch, i.e. the type that is triggered when a person or object comes close to it. Popular acceptance of this switch is severly limited by the fact that it can be easily triggered through inadvertence, this limitation making it impractical for many uses.

It is desirable, therefore, to have an apparatus and a method of preventing controls from being accidentally actuated.

BRIEF SUMMARY AND OBJECTS OF THE INVENTION

This invention solves the aforementioned problems by providing a simple process of apparatus for activating the control two or more times within a predesignated time period (usually very short) before the control will perform its control function.

An example of how this operates is a gun trigger which must be pulled once a slight distance and then again within one second before it could be pulled the full distance for firing. A child playing with the gun, for example, would not be likely to release even a hairtrigger accidentally if it were equipped with such a control. Another application is the shutter release of a camera. Such a camera will not take a picture unless the shutter release is pushed twice within one second.

The foregoing examples involve use of mechanical devices. Most uses, however, are in connection with electrical controls.

Because this invention will be used for the most part with electrical switches, the description and much of the summary and claims is directed to switches. However, it should be realized that the invention is intended to be confined only by the claims. It is intended to cover all types of controls for all electrical and mechanical devices and processes.

This invention relates to switches which are conveniently operated at will, but which essentially obviate actuation by mistake. It has this advantage over the prior art plus the one of being usable as a proximity switch.

A switch of whatever desired type is provided in combination with a means which requires that the switch be actuated two or more times within a predesignated time period (usually a very short one) before an electrical device can be energized or de-energized.

The present invention has manifold uses. A practical lamp using a proximity switch may be provided so that a hand need only be placed near a lamp to turn it on or off rather than to fumble for a manual switch. The inventor initially realized that a hand or object might often be placed near the lamp unintentionally. The present invention circumvents unintentional actuation of a lamp. Many other uses exist. Light switches of the promixity type may be used with the present invention so the hand of the user need merely be waived in its general area. This prevents the need to fumble in the dark and soil the wall switch with the hand. Any electrical devices such as televisions, radios, alarm clocks, stereos, etc. can be constructed to use the present invention and to thereby be activated or de-activated in the described manner.

Touch switches that need to be touched twice in a short time period are a failsafe system. As another example, an electrical drill has been patented requiring two buttons to turn it on. With the proposed system only one button would be required. As a further example, a watch has been patented requiring that two spots on the crystal be pressed in proper sequence to energize control elements. Using the present invention, the crystal itself can merely be touched twice without regard to different crystal locations. The crystal thus provides a large area for the control, and it is operated with one hand by pressing the crystal against the opposite arm, which might be otherwise occupied. This same system is used even when the watch crystal is used as a mechanical device instead of a touch switch. Still another use of the present invention is with lamps which are turned on and off by twice touching any metallic parts of the lamps. This avoids inadvertent actuation by a single unintentional touch.

This invention is a replacement for many safety switches used in conjunction with machines.

Some uses may require that two or more switch actuations for turning on an electrical load, but that only one actuation be required for turning it off. Or this sequence may be reversed for some applications.

This invention relates to switches which must be operated at least twice within a specified time interval in order to energize or de-energize a load. However, those skilled in the art can easily devise circuitry to require any number of switch operations in any time sequence to switch a load on or off. Thus, the present invention is not limited to any number of switch operations. The switch can be of any type such as mechanical, photoelectric, solar cell, proximity, touch or any other type of switch now existing or to be devised in the future. The easily met requirement is that the switch produce an electrical output at the time of actuation. Additionally, the load can be activated by a relay, silicone-controlled rectifier (SCR), TRIAC or any other mechanical or solid state device. As the load can easily be isolated from the power source, either the circuitry or the load can be powered from any source such as commercial power lines, battery, portable generator, etc. The various types of switches which can be used in conjunction with this invention, such as proximity, touch, sound, etc. are not described since they are commercially available and well known to those skilled in the art.

This description discloses one way of implementing the present invention, i.e. requiring that a control (in this case an electrical switch) manufactured in accordance with the present invention need be actuated two or more times within a predesignated time period before the control will serve its intended purpose (in this case, opening and closing of an electrical circuit). However, many different utilizations, both electrical and mechanical, can be employed. This invention, as covered by the claims, is intended to protect any method of or apparatus for achieving the end previously enunciated for controls of any type either electrical or mechanical.

These and other objects and features of the present invention will be apparent from the detailed description taken with reference to the accompanying drawings.

DETAILED DESCRIPTION OF THE ILLUSTRATED EMBODIMENTS

Figure 1:
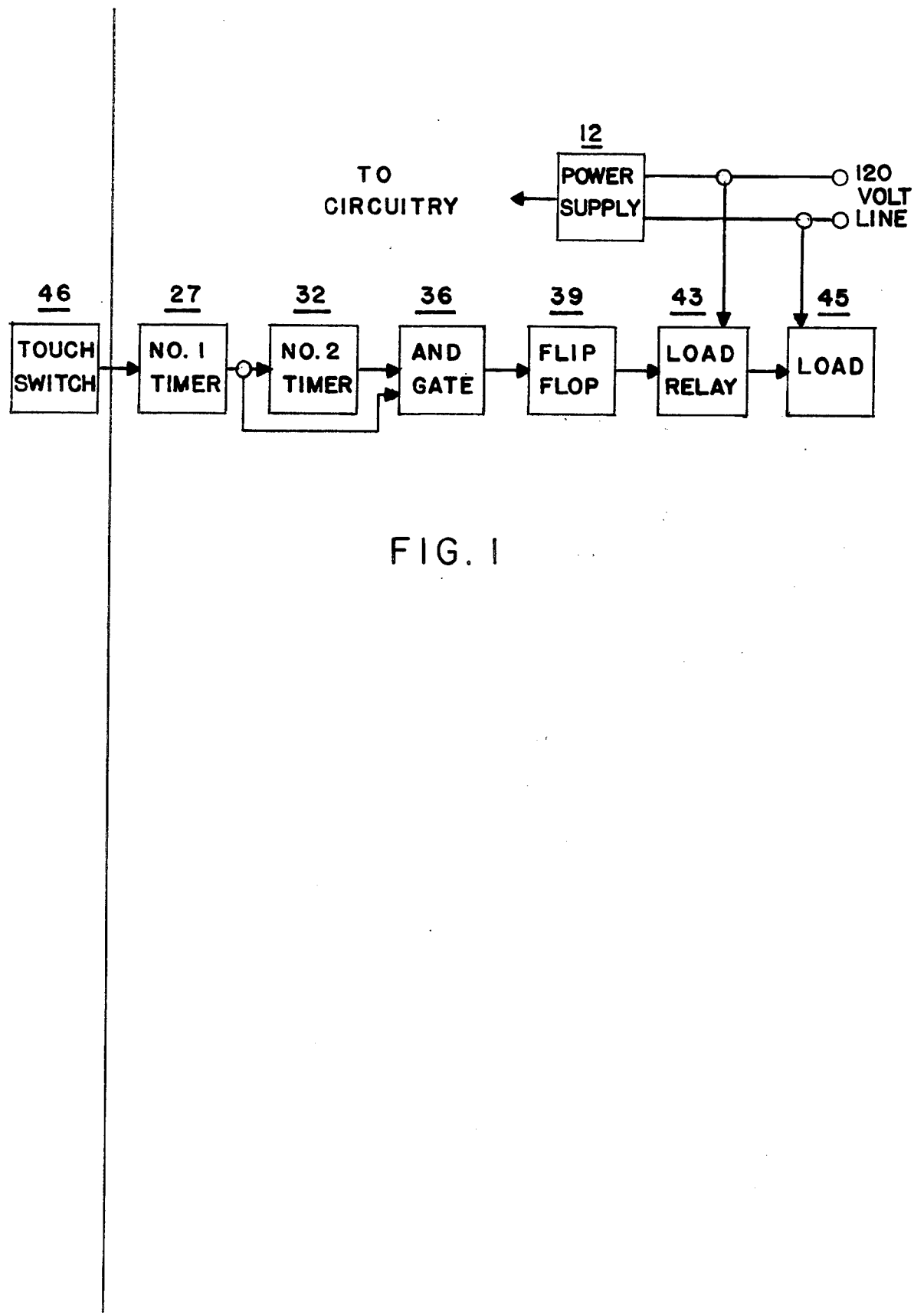
FIG. 1 is a block diagram of a typical circuit configuration representing the principles of this patent.

Reference is now made to the drawings wherein like numerals are used to designate like parts throughout and which illustrate presently preferred embodiments of the present invention. A conventional power supply 12 converts the 120 v alternating current line voltage to a low direct current voltage suitable for the circuit components. See FIGS. 1 and 2. If desired, the power supply 12 may be replaced with a battery supply. Capacitors 10 and 11 (FIG. 2) provide an effective circuitry ground for the proper operation of a touch switch 46 (FIG. 1). If desired, the touch switch 46 may be replaced with any type of switch or other means for providing input signals. For example, the touch plate 13 (FIG. 2) may be metallic trim on lamp.

Figure 2:
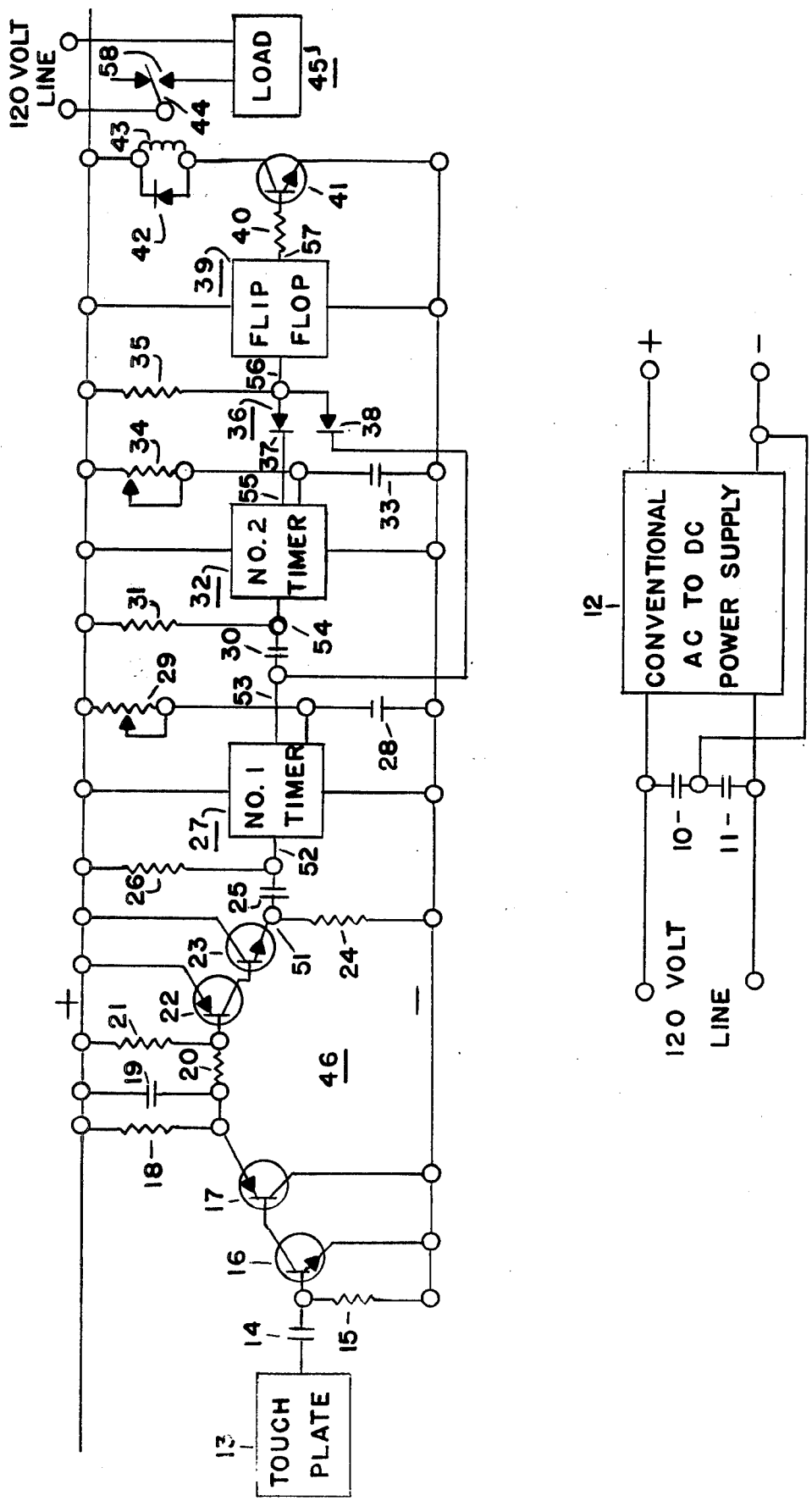
FIG. 2 is the circuit diagram of the configuration shown in FIG. 1.

With continued reference to FIG. 2, in touching plate 13, the body or other object transmits several volts to plate 13. Discontinuing the touch ends the voltage, thus producing a discrete signal which is coupled to transistor 16 by capacitor 14. Capacitor 14 isolates the body or other object which touches plate 13 from the power supply 12. Resistor 15 provides bias for transistor 16. Transistor 16 amplifies the signal which is in turn further amplified and detected by transistor 17. Resistor 18 provides the load for transistor 17. Capacitor 19 filters the detected and amplified signal to provide a DC peak signal devoid of individual signal peaks. Resistors 20 and 21 form a voltage divider to drive transistor 22. Transistors 22 and 23 further amplify the DC signal. Resistor 24 provides the load for transistor 23. Capacitor 25 and resistor 26 differentiate the signal, producing a positive-going signal when the plate 13 is touched and a negative-going signal when the touch is discontinued.

Voltage S1 at switch 13 (FIGS. 3 and 4) changes from a low level to a high level when the touch plate 13 is touched, and remains high as long as plate 13 is touched. Voltage S2 at the input to No. 1 timer 27 is normally high, near the power supply voltage. The triggering voltage level of the timer 27 is well below the ambient voltage S2. Therefore, timer 27 is activated only when a touch on the plate 13 is discontinued, i.e. the operator's hand is removed. Timer 27 is an integrated circuit timer whose output period, at S3 (FIGS. 3 and 4), is typically set at 0.05 second by capacitor 28 and variable resistor 29.

Capacitor 30 and resistor 31 differentiate the No. 1 timer 27 output S3 to produce No. 2 timer 32 trigger S4. No. 2 timer 32 is structurally and functionally the same as timer 27, except that its period is typically set at 1.5 seconds by setting capacitor 33 and variable resistor 34. Thus, only the negative-going portion of the No. 1 timer 27 output S3 can trigger No. 2 timer 32 and produce output S5.

Diodes 37 and 38 and resistor 35 constitute And gate 36, whose inputs are outputs from timer 27 and timer 32. As is well known in the art, And gate 36 will produce output S6 when output S3 from timer 27 and output S5 from timer 32 coincide. Output S6 from And gate 36 changes the output state of flip-flop 39 from low to high or vice versa. A low level at flip-flop 39 output S7 leaves transistor 41 off and leaves relay 43 de-energized. Relay contacts 44 are therefore open, preventing power from reaching load 45. Changing the output S7 of flip-flop 39 to high, turns on transistor 41, energizes relay 43, closes contacts 44 and energizes load 45.

Resistor 40 limits the base current of transistor 41. Diode 42 suppresses the inductive kick from relay 43, thus protecting transistor 41.

Figure 3:
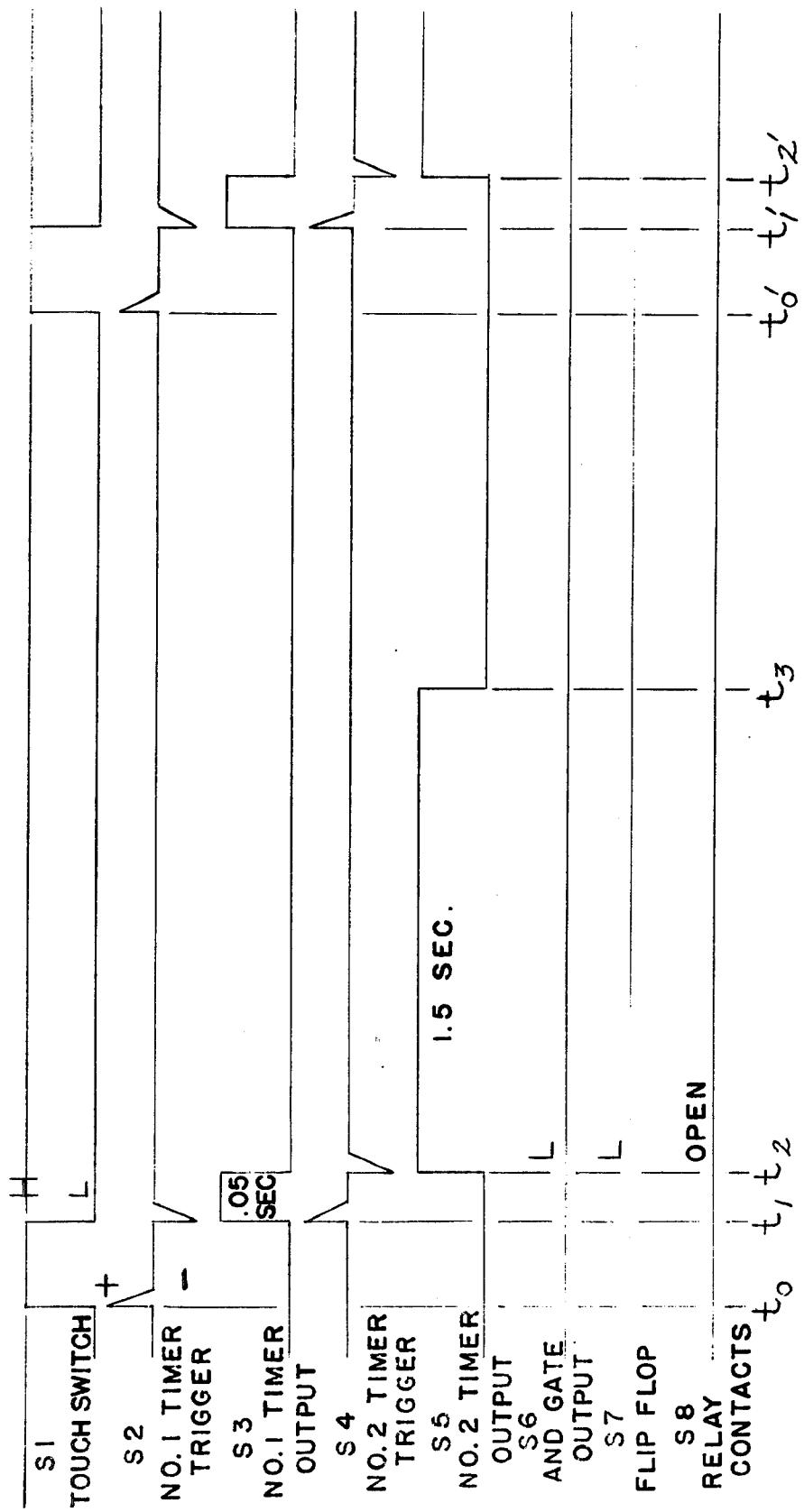
FIG. 3 and FIG. 4 are timing waveform diagrams to facilitate the explanation of the circuit.
Figure 4:
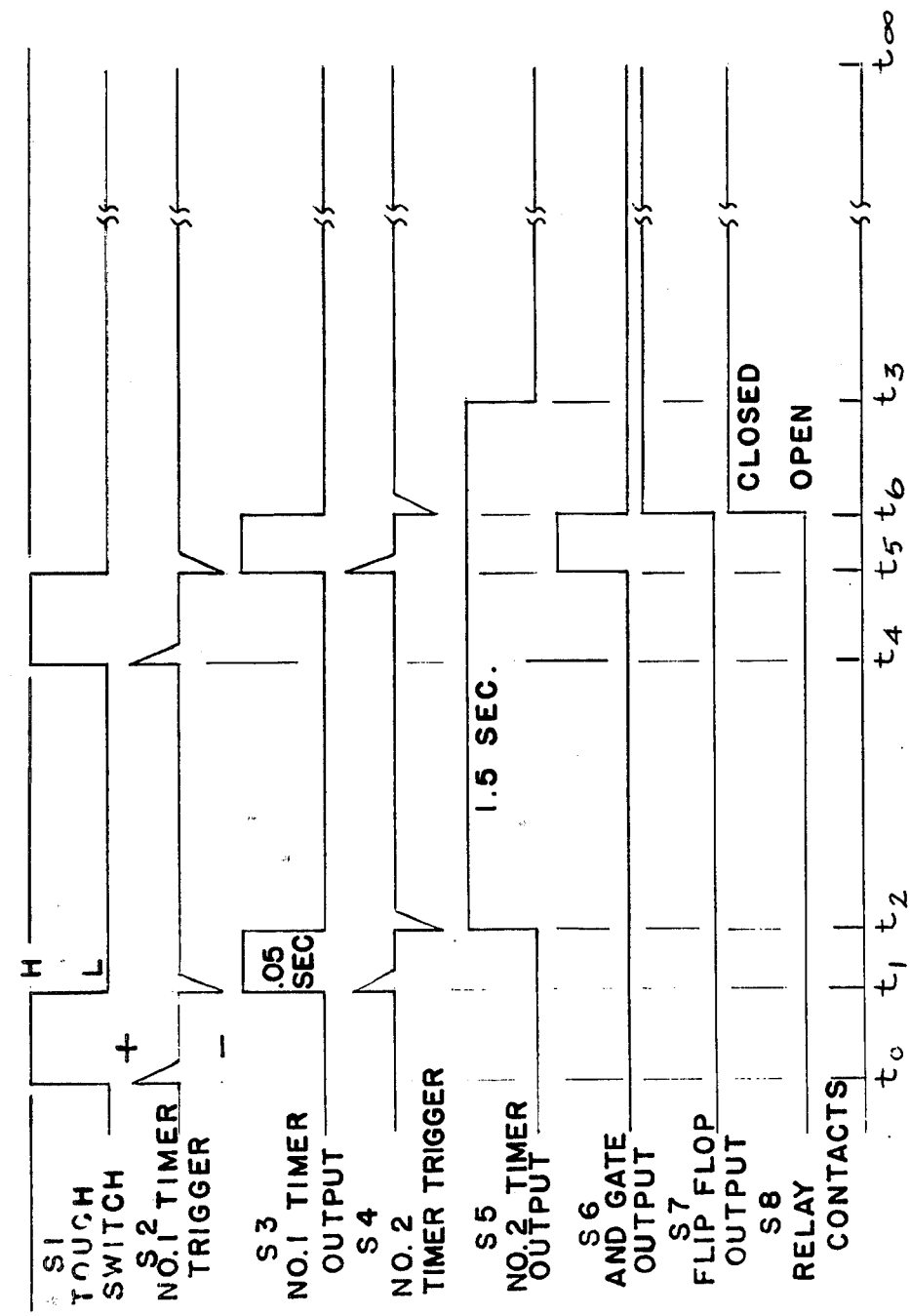

The operation of the invention can be more easily understood by reference to the wave forms depicted in FIGS. 3 and 4. FIG. 3 shows the wave form for an incorrect time sequence touching of plate 13. FIG. 4 shows the wave form for a correct time sequence touching of plate 13. Referring to FIG. 3, in the initial state, the relay contacts 44 are open, S2 and S4 are ambient, and all other signals are low. When the user touches the touch plate 13, at time $t_0$, S1 goes high and S2 goes positive. When the user removes his hand from plate 13, at time $t_1$, S1 goes low and S2 goes negative, which triggers No. 1 timer 27 causing S3 to go high and S4 to go positive. S3 remains high until timer 27 runs out, 0.05 second after $t_1$, or at $t_2$. At $t_2$, S3 goes low, causing S4 to go negative which triggers No. 2 timer 32. No. 2 timer 32 output S5 goes high until 1.5 seconds after $t_2$, or at $t_3$. S3 and S5 are sequential and, therefore, cannot produce an output from And gate 36. The load 45 remains off, as in the initial state.

Referring to FIG. 4, conditions from $t_0$ to $t_2$ are the same as depicted in and described above in conjunction with FIG. 3. When the user touches plate 13, at time $t_4$ (before No. 2 timer 32 period S5 ends at $t_3$), S1 goes high and S2 goes positive. When the user removes his hand from plate 13, at $t_5$, S1 goes low and S2 goes negative, thus trigerring No. 1 timer 27, causing S3 to go high. As No. 2 timer 32 is still in its triggered state (high), S3 and S5 produce a high output S6 at And gate 36, from $t_5$ to $t_6$ at which time S3 and S6 go low. When S6 goes low, at $t_6$, flip-flop 39 changes state, closing the relay contacts 44 and energizing the load 45. As S3 goes low, at $t_6$, No. 2 timer can not be retriggered, because its timing cycle has not ended. The circuit will remain energized until two or more touch sequences occur at touch plate 13 within the specified time interval. At this time, flip-flop 39 opens relay contacts 44 and de-energizes the load 45.

The periods of the two timers can be set to accommodate the response time of the operator.

The above description of the present invention requiring two operations of the touch plate 13 to energize or de-energize the load 45 is not to imply that the present invention is limited to the mode of operation. One simple implementation for requiring any number (N) of switch operations to energize or de-energize the load 45 is as follows:

Insert a frequency divider circuit between the And gate 36 output and the input to flip-flop 39. For each two properly timed touches of the touch plate 13, one pulse will be applied to the frequency divider. Therefore, if the frequency divider divides by N/2, N switch operations are required for each load 45 energization or de-energization.

The present invention may be embodied in other specific forms without departing from the spirit or essential characteristics thereof. The present embodiment is therefore considered in all respects as illustrative and not restrictive, the scope of the invention being indicated by the appended claims rather than by the foregoing description, and all changes which come within the meaning and range of equivalency of the claims are therefore intended to be embraced therein.

What is claimed and desired to be secured by United States Letters Patent is:

1. A light fixture consisting of a support; at least one source of illumination attached to the support; means controlling the illumination; and means for actuating the illumination control when a physical object is placed in proximity to the light fixture a plurality of times within a predesignated time period.

2. An actuator for an electrical device for providing an actuating signal to the device when a plurality of events occur within a specified interval of time comprising:
    signal generating means for generating a signal responsive to certain perceptible events, said signal having a trailing edge;
    pulse means responsive to the trailing edge of the signal from the signal generating means for producing at least one pulse of a given duration, said pulse having a trailing edge;
    interval means responsive to the trailing edge of the pulse from the pulse means for producing at least one derivative pulse of a predetermined duration equivalent to the specified interval;
    time coincidence means responsive to coincidental pulses from the pulse means and interval means for producing at least one output signal; and
    control means responsive to the output signal from the time coincidence means for producing at least one actuating signal and communicating the same to the electrical device.

3. An actuator according to claim 2 wherein the pulse means comprise timer means.

4. An actuator according to claim 2 wherein the interval means comprise timer means.

5. An actuator according to claim 2 wherein the time coincidence means comprise And gate means.

6. An actuator according to claim 2 wherein the control means comprise flip-flop means.

7. An actuator according to claim 2 wherein the signal generating means comprise proximity-type control means.

8. A method for actuating an electrical device by providing an actuating signal to the device when a plurality of events occur within a specified interval of time, comprising the steps of:
    producing at least one signal in response to each of a plurality of certain perceptible events, said signal having a trailing edge;
    generating at least one response pulse of a given duration in response to the trailing edge of said signal, said response pulse having a trailing edge;
    developing at least one interval pulse of a predetermined duration, equivalent to said specified interval, in response to the trailing edge of said response pulse;
    producing an output signal when the response pulse and the interval pulse are determined to coincide; and
    causing the output signal to change the state of a control for the electrical device whereby an activating signal is communicated to the electrical device.

9. A circuit for providing a controlling output signal when a plurality of input signals having trailing edges, occur within a given interval of time, comprising:
    pulse means responsive to the trailing edge of the input signal for producing at least one pulse of a given duration, said pulse having a trailing edge;
    interval means responsive to the trailing edge of the pulse from the pulse means for producing at least one derivative pulse of a predetermined duration equivalent to the specified interval;
    time coincidence means responsive to coincidental pulses from the pulse means and interval means for producing at least one output signal; and
    control means responsive to the output signal from the time coincidence means for producing at least one actuating signal and communicating the same to the electrical device.

10. An electrical device comprising:
    a load;
    signal generating means for generating a signal responsive to certain perceptible events, said signal having a trailing edge;
    actuating means for energizing the load responsive to a plurality of signal trailing edges from the signal generating means wherein said trailing edges occur within a designated time interval.

11. Apparatus for preventing inadvertent actuation of a control comprising in combination:
    means intermediate a control and a device to be controlled, said means comprising means which intercept electrical impulses from the control and means which ascertain whether successive impulses occur and are so intercepted within a prescribed interval of time without requiring a definitive time span between impulses, and means for releasing one or more impulses to actuate the device when the ascertaining means have determined that said impulses have been intercepted within the prescribed time interval.

12. In combination: at least one electrically controlled device, means controlling the operability of the device, and means to in turn operate the device for actuating the controlling means when a physical object is placed in proximity to a predetermined location a plurality of times within a predesignated time period without regard to the span of time between placement of the physical object in said proximity.

* * * * *